US 10,096,703 B2

(12) United States Patent
Harada et al.

(10) Patent No.: US 10,096,703 B2
(45) Date of Patent: Oct. 9, 2018

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Yuichi Harada, Matsumoto (JP); Yasuyuki Hoshi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/279,490

(22) Filed: Sep. 29, 2016

(65) Prior Publication Data

US 2017/0141222 A1    May 18, 2017

(30) Foreign Application Priority Data

Nov. 13, 2015  (JP) .................... 2015-223473

(51) Int. Cl.
*H01L 29/78* (2006.01)
*H01L 29/06* (2006.01)
(Continued)

(52) U.S. Cl.
CPC ...... *H01L 29/7811* (2013.01); *H01L 29/0615* (2013.01); *H01L 29/0661* (2013.01);
(Continued)

(58) Field of Classification Search
CPC ................. H01L 29/7811; H01L 29/0661
See application file for complete search history.

(56) References Cited

U.S. PATENT DOCUMENTS

2002/0063300 A1    5/2002  Miyajima
2006/0097267 A1*   5/2006  Kumar ............ H01L 29/66068
                                                         257/77
(Continued)

FOREIGN PATENT DOCUMENTS

JP    2002-164541 A    6/2002
JP    2006-165225 A    6/2006
(Continued)

OTHER PUBLICATIONS

Krishna Shenai et al., "Optimum Semiconductors for High-Power Electronics", IEEE Transactions on Electron Devices, vol. 36, No. 9, pp. 1811-1823, Sep. 1989.
(Continued)

*Primary Examiner* — Moazzam Hossain
*Assistant Examiner* — Farun Lu
(74) *Attorney, Agent, or Firm* — Rabin & Berdo, P.C.

(57) ABSTRACT

A recess where an edge termination region is lower than an active region is disposed on a silicon carbide base body and an n⁻-type silicon carbide layer is exposed at a bottom of the recess. In the portion of the n⁻-type silicon carbide layer exposed at the bottom of the recess, first and second JTE regions configuring a JTE structure are disposed. The first JTE region is disposed from the bottom of the recess, along a side wall and covers a bottom corner portion of the recess. The first JTE region overlaps an outermost first p-type base region at the bottom corner portion. The first JTE region has an impurity concentration that is highest at the portion overlapping the first p-type base region and distribution of the impurity concentration in a depth direction peaks at a portion deeper than the bottom of the recess.

9 Claims, 7 Drawing Sheets

(51) Int. Cl.
*H01L 29/10* (2006.01)
*H01L 29/66* (2006.01)
*H01L 29/16* (2006.01)
*H01L 29/08* (2006.01)

(52) U.S. Cl.
CPC ...... *H01L 29/1095* (2013.01); *H01L 29/1608* (2013.01); *H01L 29/66068* (2013.01); *H01L 29/0878* (2013.01)

(56) References Cited

U.S. PATENT DOCUMENTS

| | | |
|---|---|---|
| 2006/0118812 A1 | 6/2006 | Ohtsuka et al. |
| 2010/0219417 A1 | 9/2010 | Miura et al. |
| 2015/0048489 A1* | 2/2015 | Van Brunt ............ H01L 29/861 257/655 |
| 2015/0279926 A1 | 10/2015 | Hiyoshi et al. |

FOREIGN PATENT DOCUMENTS

| | | |
|---|---|---|
| JP | 2010-045388 A | 2/2010 |
| JP | 2010-050147 A | 3/2010 |
| JP | 2014-107500 A | 6/2014 |

OTHER PUBLICATIONS

B. Jayant Baliga, "Silicon Carbide Power Devices", U.S.A, World Scientific Publishing Co., pp. 60-69, Mar. 30, 2006.

* cited by examiner

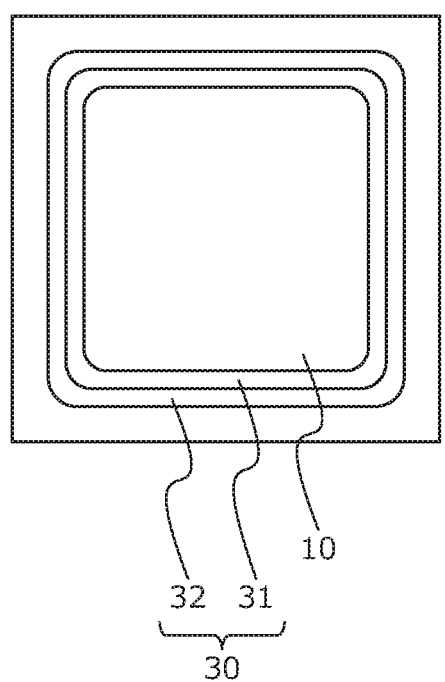

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2015-223473, filed on Nov. 13, 2015, the entire contents of which are incorporated herein by reference.

BACKGROUND OF THE INVENTION

Field of the Invention

The embodiments discussed herein relate to a semiconductor device and a method of manufacturing a semiconductor device.

Description of the Related Art

Conventionally, silicon (Si) is used as a constituent material of a power semiconductor device that controls high voltage and/or large current. There are several types of power semiconductor devices such as bipolar transistors, insulated-gate bipolar transistors (IGBTs), and metal oxide semiconductor field effect transistors (MOSFETs). These devices are selectively used according to intended purpose.

For example, bipolar transistors and IGBTs have high current density compared to MOSFETs, and can be adapted for large current but cannot be switched at high speed. In particular, the limit of switching frequency is about several kHz for bipolar transistors and about several tens of kHz for IGBTs. On the other hand, power MOSFETs have low current density compared to bipolar transistors and IGBTs, and are difficult to be adapted for large current but can be switched at high speed up to about several MHz.

However, there has been a strong demand in the market for a power semiconductor device achieving both large current and high speed. Thus, IGBTs and power MOSFETs have been intensively developed and improved, and the performance of power devices has substantially reached the theoretical limit determined by the material. In terms of power semiconductor devices, semiconductor materials replacing silicon have been investigated and silicon carbide (SiC) has been focused on as a semiconductor material enabling production (manufacture) of a next-generation power semiconductor device with low on voltage, high-speed characteristics, and high-temperature characteristics (see, for example, K. Shenai, et al, "Optimum Semiconductors for High-Power Electronics", IEEE Transactions on Electron Devices, September 1989, Vol. 36, No. 9, pages 1811-1823).

Silicon carbide is chemically a very stable semiconductor material, has a wide band gap of 3 eV, and can be used very stably as a semiconductor even at high temperatures. Silicon carbide has a critical electric field strength that is ten times that of silicon or greater, and thus is expected to be a semiconductor material that can sufficiently reduce on-resistance. These merits of silicon carbide are common to other wide band gap semiconductors (hereinafter, wide band gap semiconductor) with a band gap greater than silicon, such as gallium nitride (GaN). Thus, a high-voltage semiconductor device can be achieved by using a wide band gap semiconductor (see, for example, B. Jayant Baliga, "Silicon Carbide Power Devices", U.S.A, World Scientific Publishing Co., Mar. 30, 2006, page 61).

In such high-voltage semiconductor devices, high voltage is not only applied to an active region in which device structures are formed and current flows in an on-state but also to an edge termination region surrounding the periphery of the active region and preventing breakdown voltage. Electric field concentrates in the edge termination region. The breakdown voltage of a high-voltage semiconductor device is determined by the impurity concentration, the thickness, and electric field strength of the semiconductor. The resistance to breakdown determined in this manner by semiconductor-specific characteristics is constant from the active region to the edge termination region. Therefore, consequent to the concentration of electric field at the edge termination region, the edge termination region is at risk of being subject to an electrical load that exceeds the resistance to breakdown, leading to destruction. In other words, the breakdown voltage of a high-voltage semiconductor device is limited by the resistance to breakdown at the edge termination region.

As a device that improves the breakdown voltage of a high-voltage semiconductor device overall by distributing or mitigating the electric field of the edge termination region, devices are known that dispose a breakdown voltage structure such as junction termination extension (JTE) structure or a field limiting ring (FLR) structure in the edge termination region (see, for example, Japanese Patent Application Laid-Open Publication Nos. 2010-50147 and 2006-165225). In Japanese Patent Application Laid-Open Publication No. 2010-50147, a floating metal electrode contacting an FLR is disposed as a field plate (FP) to release charge generated at the edge termination region and thereby, improve reliability.

A MOSFET including a JTE structure will be taken as an example to describe a breakdown voltage structure of a conventional high-voltage semiconductor device. FIG. 6 is a cross-sectional view of a structure of a conventional semiconductor device. A conventional semiconductor device depicted in FIG. 6 includes on a semiconductor base body formed from silicon carbide (hereinafter, silicon carbide base body (semiconductor chip)) 140, an active region 110 and an edge termination region 120 surrounding the periphery of the active region 110. The silicon carbide base body 140 is an $n^+$-type supporting substrate formed from silicon carbide (hereinafter, $n^+$-type silicon carbide substrate) 101 on which an $n^-$-type semiconductor layer formed from silicon carbide (hereinafter, $n^-$-type silicon carbide layer) 102 and a p-type semiconductor layer formed from silicon carbide (hereinafter, p-type silicon carbide layer) 104 are sequentially stacked on a front surface of the $n^+$-type silicon carbide substrate 101.

In the active region 110, a metal oxide semiconductor (MOS) gate structure is disposed on a front surface (surface on the p-type silicon carbide layer 104 side) side of the silicon carbide base body 140. The p-type silicon carbide layer 104 is removed from the entire edge termination region 120, whereby on the front surface of the silicon carbide base body 140, a recess 121 is formed that makes the edge termination region 120 lower than the active region 110 (recessed toward the drain side) and the $n^-$-type silicon carbide layer 102 becomes exposed at a bottom 121a of the recess 121. In the edge termination region 120, a JTE structure 130 is disposed that includes multiple adjacent $p^-$-type low-concentration regions having progressively lower impurity concentrations the farther the $p^-$-type low-concentration region is disposed toward the outer side (chip edge side) (two in the present example, indicated by reference numerals 131, 132 and assumed to be a $p^-$-type and a $p^{--}$-type sequentially from an inner side of the edge termination region 120) arranged adjacently.

The p⁻-type low-concentration region (hereinafter, first JTE region) 131 and the p⁻⁻-type low-concentration region (hereinafter, second JTE region) 132 are each selectively disposed in the n⁻-type silicon carbide layer 102, at a portion exposed at the bottom 121a of the recess 121. At the bottom 121a of the recess 121, the first JTE region 131 contacts an outermost p-type base region 103. The JTE structure 130 and a portion 103a of the p-type base region 103, extending into the bottom 121a of the recess 121 form the breakdown voltage structure. A drain electrode 115 contacting a back surface of the silicon carbide base body 140 (back surface of the n⁺-type silicon carbide substrate 101) is disposed. Reference numerals 105 to 109, and 111 to 114 indicate an n⁺-type source region, a p⁺-type contact region, an n-type JFET region, a gate insulating film, a gate electrode, a field oxide film, an interlayer insulating film, a source electrode, and a passivation film, respectively.

In the MOSFET having the structure depicted in FIG. 6, when a positive voltage with respect to the source electrode 113 is applied to the drain electrode 115 and a voltage lower than the threshold voltage is applied to the gate electrode 109, a pn junction between a p-type base region 104a and an n-type JFET region 107 becomes reverse biased, the reverse breakdown voltage of the active region is not reached, and no current flows. The p-type base region 104a is a portion of the p-type silicon carbide layer 104, excluding the n⁺-type source region 105 and the p⁺-type contact region 106.

On the other hand, when a voltage equal to or higher than the threshold voltage is applied to the gate electrode 109, an n-type inversion layer (channel) is formed at the surface layer of a portion of the p-type base region 104a directly beneath the gate electrode 109 (drain side). Consequently, current flows through a path of the n⁺-type silicon carbide substrate 101, the n⁻-type silicon carbide layer 102, the n-type JFET region 107, the inversion layer on the surface of the p-type base region 104a, and the n⁺-type source region 105. Thus, a commonly known MOSFET switching operation may be performed by controlling the gate voltage.

Further, in the MOSFET having the structure depicted in FIG. 6, when voltage is applied, a depletion layer spreads outwardly from a pn junction between the p-type base region 103 and an n⁻-type drift layer, to both the first and second JTE regions 131, 132. The n⁻-type drift layer is a portion of the n⁻-type silicon carbide layer 102, excluding the p-type base region 103 and the first and second JTE regions 131, 132. The breakdown voltage at the edge termination region is sustained by a pn junction between the first and second JTE regions 131, 132 and the n⁻-type drift layer.

As another high-voltage semiconductor device, a device has been proposed in which on the front surface of a silicon carbide base body, a recess is formed where the edge termination region is lower than the active region, and a p-type region forming a breakdown voltage structure is disposed to cover a boundary of a side wall and bottom of the recess (hereinafter, bottom corner portion of the recess) (see, for example, Japanese Patent Application Laid-Open Publication Nos. 2010-045388, 2002-164541, and 2014-107500).

SUMMARY OF THE INVENTION

According to one aspect of the present invention, a semiconductor device includes an active region in which main current flows, the active region disposed on a semiconductor substrate of a first conductivity type and formed of a semiconductor material having a band gap that is wider than that of silicon; an edge termination region surrounding a periphery of the active region; a recess where the edge termination region is lower than the active region, disposed on a front surface of the semiconductor substrate; a first semiconductor region of a second conductivity type, selectively disposed on a front surface side of the semiconductor substrate in the active region and extending to a first face formed in the edge termination region by the recess; and semiconductor regions of the second conductivity type disposed in the first face to have a concentric ring-shape surrounding the periphery of the active region and to have progressively lower impurity concentrations as proximity to an outer side increases. An innermost semiconductor region among the semiconductor regions of the second conductivity type is disposed from the first face, along a third face between the first face and a second face farther on the active region side than the recess.

In the semiconductor device, a portion of the innermost semiconductor region is positioned to overlap in a depth direction, a portion of the first semiconductor region, at a boundary of the first face and the third face. The innermost semiconductor region has an impurity concentration that is highest at a portion overlapping the first semiconductor region.

In the semiconductor device, a thickness of the innermost semiconductor region is thicker than a thickness of the first semiconductor region, at the first face.

In the semiconductor device, the third face is sloped to form an obtuse angle with the first face.

The semiconductor device further includes a second semiconductor region of the first conductivity type, selectively disposed in the first semiconductor region; a gate insulating film disposed to contact a region of the first semiconductor region between the second semiconductor region and the semiconductor substrate; a gate electrode disposed via the gate insulating film, on a side opposite the first semiconductor region; a first electrode disposed to contact the first semiconductor region and the second semiconductor region; and a second electrode disposed to contact a back surface of the semiconductor substrate.

In the semiconductor device, the semiconductor material having a band gap that is wider than that of silicon is silicon carbide.

According to another aspect of the invention, a method of manufacturing a semiconductor device including an active region disposed on a semiconductor substrate of a first conductivity type and formed from a semiconductor material having a band gap that is wider than that of silicon, and an edge termination region surrounding a periphery of the active region, includes forming on a front surface of the semiconductor substrate, a recess where the edge termination region is lower than the active region; selectively forming on a front surface side of the semiconductor substrate in the active region, a first semiconductor region of a second conductivity type, the first semiconductor region formed to extend to a first face formed in the edge termination region by the recess; and forming in the first face, semiconductor regions of the second conductivity type, the semiconductor regions formed to have a concentric ring-shape surrounding the periphery of the active region and to have progressively lower impurity concentrations as proximity to an outer side increases. The forming of the semiconductor regions of the second conductivity type includes forming an innermost semiconductor region among the semiconductor regions of the second conductivity type from the first face, along a third face between the first face and a second face farther on the active region side than the recess.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 7 is a top view of the structure of the semiconductor device according to the embodiment.

DETAILED DESCRIPTION OF THE INVENTION

Figure 1:
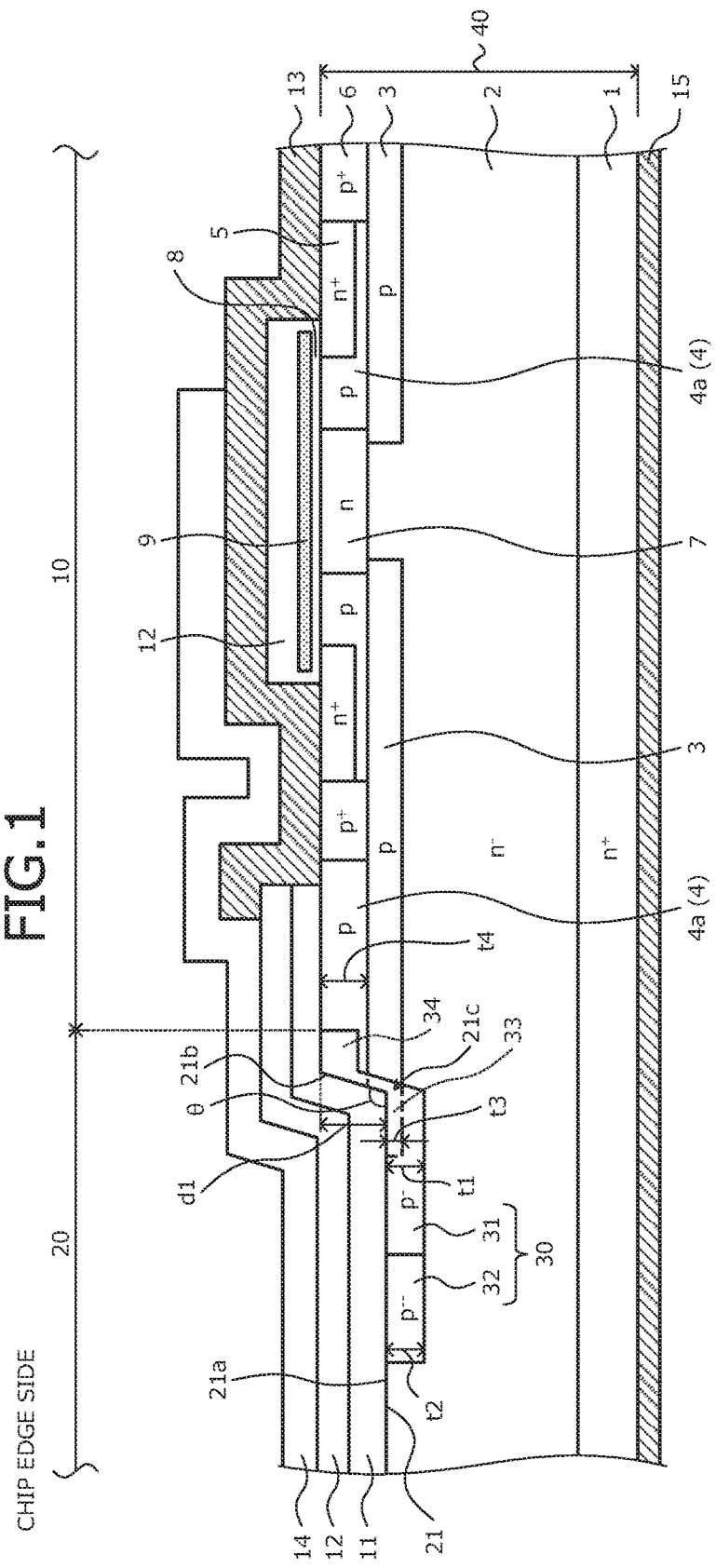
FIG. 1 is a cross-sectional view of a structure of a semiconductor device according to an embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described. Further, in the present description, when Miller indices are described, "−" means a bar added to an index immediately after the "−", and a negative index is expressed by prefixing "−" to the index.

The semiconductor device according to the present invention is formed using a wide band gap semiconductor material. In the present embodiment, a silicon carbide semiconductor device produced using, for example, silicon carbide (SiC) as a wide band gap semiconductor material will be described taking a planar gate-type MOSFET as an example. FIG. 1 is a cross-sectional view of a structure of the semiconductor device according to the embodiment. As depicted in FIG. 1, the silicon carbide semiconductor device according to the embodiment includes, on a semiconductor base body formed from silicon carbide (hereinafter, silicon carbide base body (semiconductor substrate (semiconductor chip))) 40, an active region 10 and an edge termination region 20 surrounding a periphery of the active region 10. The active region 10 is a region through which current flows in an on-state. The edge termination region 20 is a region that mitigates the electric field of a base body front surface side of a drift region and sustains the breakdown voltage.

The silicon carbide base body 40 is formed by an n$^-$-type semiconductor layer (n$^-$-type silicon carbide layer) 2 formed from silicon carbide and a p-type semiconductor layer (p-type silicon carbide layer) 4 formed by silicon carbide, sequentially stacked on a front surface of an n$^+$-type supporting substrate (n$^+$-type silicon carbide substrate) 1 formed from silicon carbide. The n$^+$-type silicon carbide substrate 1 functions as a drain region. In the active region 10, p-type base regions (first semiconductor regions) 3 are selectively disposed in a surface layer of the n$^-$-type silicon carbide layer 2, on a side opposite (base body front surface side) the n$^+$-type silicon carbide substrate 1 side. The outermost (chip edge side) p-type base region 3 extends from the active region 10 side to a bottom (first face) 21a of a recess 21 described hereinafter and a portion of the p-type base region 3 is exposed at the bottom 21a of the recess 21. The bottom 21a of the recess 21 is a front surface of the silicon carbide base body 40 newly formed at the edge termination region 20 by the formation of the recess 21. Exposure at the bottom 21a of the recess 21 is an arrangement to enable contact with a field oxide film 11 described hereinafter. A portion of the n$^-$-type silicon carbide layer 2, excluding the p-type base region 3 and first and second JTE regions 31, 32 described hereinafter is a drift region.

On the surface of the n$^-$-type silicon carbide layer 2, on a side opposite the n$^+$-type silicon carbide substrate 1 side, a p-type silicon carbide layer 4 is provided so as to cover the p-type base region 3. The impurity concentration of the p-type silicon carbide layer 4 is lower than the impurity concentration of the p-type base region 3. In the p-type silicon carbide layer 4, at a portion facing the p-type base region 3 in a direction of depth, an n$^+$-type source region (second semiconductor region) 5 and a p$^+$-type contact region 6 are each selectively disposed. Further, in the p-type silicon carbide layer 4, an n-type semiconductor region 7 is disposed penetrating the p-type silicon carbide layer 4 in the direction of depth and reaching the n$^-$-type silicon carbide layer 2. The n-type semiconductor region 7 is disposed away from the n$^+$-type source region 5, on a side of the n$^+$-type source region 5, opposite the p$^+$-type contact region 6.

A portion (hereinafter, second p-type base region (first semiconductor region)) 4a of the p-type silicon carbide layer 4 excluding the n$^+$-type source region 5, the p$^+$-type contact region 6, and the n-type semiconductor region 7 functions and as a base region together with the p-type base regions (hereinafter, first p-type base regions) 3. The n-type semiconductor region (hereinafter, n-type JFET region) 7 is a junction FET (JFET) region between adjacent base regions and functions as the n$^-$-type silicon carbide layer 2 and a drift region. The impurity concentration of the n-type JFET region 7 between adjacent base regions is made higher than the impurity concentration of the n$^-$-type silicon carbide layer 2, facilitating reduction of the JFET resistivity.

On a surface of a portion of the second p-type base region 4a between the n$^+$-type source region 5 and the n-type JFET region 7, a gate electrode 9 is disposed via a gate insulating film 8, from the n$^+$-type source region 5 to the n-type JFET region 7. The first and second p-type base regions 3, 4a, the n$^+$-type source region 5, the p$^+$-type contact region 6, the gate insulating film 8, and the gate electrode 9 configure a MOS gate structure on the front surface side of the silicon carbide base body 40 (surface of the p-type silicon carbide layer 4 side). In FIG. 1, although one MOS gate structure is depicted, multiple MOS gate structures may be arranged in parallel in the active region 10. A source electrode (first electrode) 13 contacts the n$^+$-type source region 5 and the p$^+$-type contact region 6 and is electrically insulated from the gate electrode 9 by an interlayer insulating film 12.

The p-type silicon carbide layer 4 is removed from the entire edge termination region 20, whereby on the front surface of the silicon carbide base body 40, the recess 21 is formed where the edge termination region 20 is lower than the active region 10 (recessed toward the drain side). In other words, at the bottom 21a of the recess 21, the n$^-$-type silicon carbide layer 2 is exposed. A side wall (third face) 21b of the recess 21 is the front surface of the silicon carbide base body 40 positioned between the bottom 21a of the recess 21 and base body front surface (second face) farther on the active region 10 side than the recess 21, and sloped to form an obtuse angle (angle θ) with the bottom 21a of the recess 21. The angle θ formed by the bottom 21a and the side wall 21b of the recess 21, for example, may be about 90 degrees (90 degrees≤θ<180 degrees). The side wall 21b of the recess 21, for example, is positioned near the boundary of the edge termination region 20 with the active region 10. A depth d1 of the recess 21 is equal to or greater than a thickness t4 (d1≥4) of the p-type silicon carbide layer 4, and at the side wall 21b of the recess 21, the p-type silicon carbide layer 4, or the p-type silicon carbide layer 4 and the first p-type base region 3 are exposed.

A boundary 21c of the bottom 21a and the side wall 21b of the recess 21 (hereinafter, bottom corner portion of the recess 21) is positioned farther on the drain side than the boundary of the p-type silicon carbide layer 4 and the outermost first p-type base region 3, and at a depth not penetrating through the outermost first p-type base region 3. In other words, at least the drain side of the bottom corner portion 21c of the recess 21 is covered by the outermost first p-type base region 3. The recess 21 is disposed to have a substantially ring-shaped planar layout surrounding the periphery of the active region 10. Further, in the edge termination region 20, a JTE structure 30 is disposed that includes multiple adjacent p⁻-type low-concentration regions (semiconductor regions of a second conductivity type, herein, two including a p⁻-type and a p⁻⁻-type indicated by reference numerals 31, 32 from the inner side (the active region 10 side)) having progressively lower impurity concentrations the farther the p⁻-type low-concentration region is disposed toward the outer side. FIG. 7 is a top view of the structure of the semiconductor device according to the embodiment. As depicted in FIG. 7, the JTE structure 30 is disposed to have a substantially ring-shaped planar layout surrounding the periphery of the active region 10.

The p⁻-type low-concentration region (hereinafter, first JTE region) 31 is disposed along the side wall 21b from the bottom 21a of the recess 21 and covers the bottom corner portion 21c. As a result, a portion of the first JTE region 31 overlaps a portion of the outermost first p-type base region 3 in the depth direction (dotted-line portion indicated by reference numeral 33) at the bottom corner portion 21c of the recess 21. In other words, the first JTE region 31 has the highest impurity concentration at the portion 33 overlapping the first p-type base region 3, and in terms of distribution in the depth direction, the impurity concentration demonstrates a peak near the bottom corner portion 21c of the recess 21, at a portion deeper on the drain side than the bottom 21a of the recess 21. The first JTE region 31 may be disposed to overlap the second p-type base region 4a at the side wall 21b of the recess 21 (dotted-lined portion indicated by reference numeral 34). A thickness (depth from the bottom 21a of the recess 21) t1 of a portion of the first JTE region 31 at the bottom 21a of the recess 21 is greater than a thickness t3 of a portion of the first p-type base region 3 at the bottom 21a of the recess 21 (t1>t3).

A p⁻⁻-type low-concentration region (hereinafter, second JTE region) 32 is disposed along the bottom corner portion 21c of the recess 21 and contacts the outer side of the first JTE region 31. A thickness t2 of the second JTE region 32 is about equal to a thickness t1 of a portion of the first JTE region 31 at the bottom 21a of the recess 21 (t1≈t2). The first and second JTE regions 31, 32 are disposed to have a concentric ring-shaped planar layout. A width of a portion of the first and second JTE regions 31, 32 along the bottom 21a of the recess 21 may be progressively narrower the farther the portion is disposed on the outer side. In FIG. 1, a case is depicted where the first JTE region 31 is disposed to overlap the first and second p-type base regions 3, 4a, and the end of the first JTE region 31 on the inner side is positioned farther on the inner side than the side wall 21b of the recess 21.

The edge termination region 20 is from the chip end to the end of the first JTE region 31 on the inner side. On the front surface of the silicon carbide base body 40 in the edge termination region 20, the interlayer insulating film 12 extends from the active region 10 side and covers the first and second JTE regions 31, 32. Between the front surface of the silicon carbide base body 40 and the interlayer insulating film 12 in the edge termination region 20, the field oxide film 11 may be disposed. Further, on the interlayer insulating film 12 in the edge termination region 20, a passivation film, for example, a protection film 14 formed from polyimide is disposed. The protection film 14 has a function of preventing discharge. The protection film 14 may extend onto an end of the source electrode 13. On the back surface of the silicon carbide base body 40 (back surface of the n⁺-type silicon carbide substrate 1), a drain electrode (second electrode) 15 is disposed.

Figure 2:
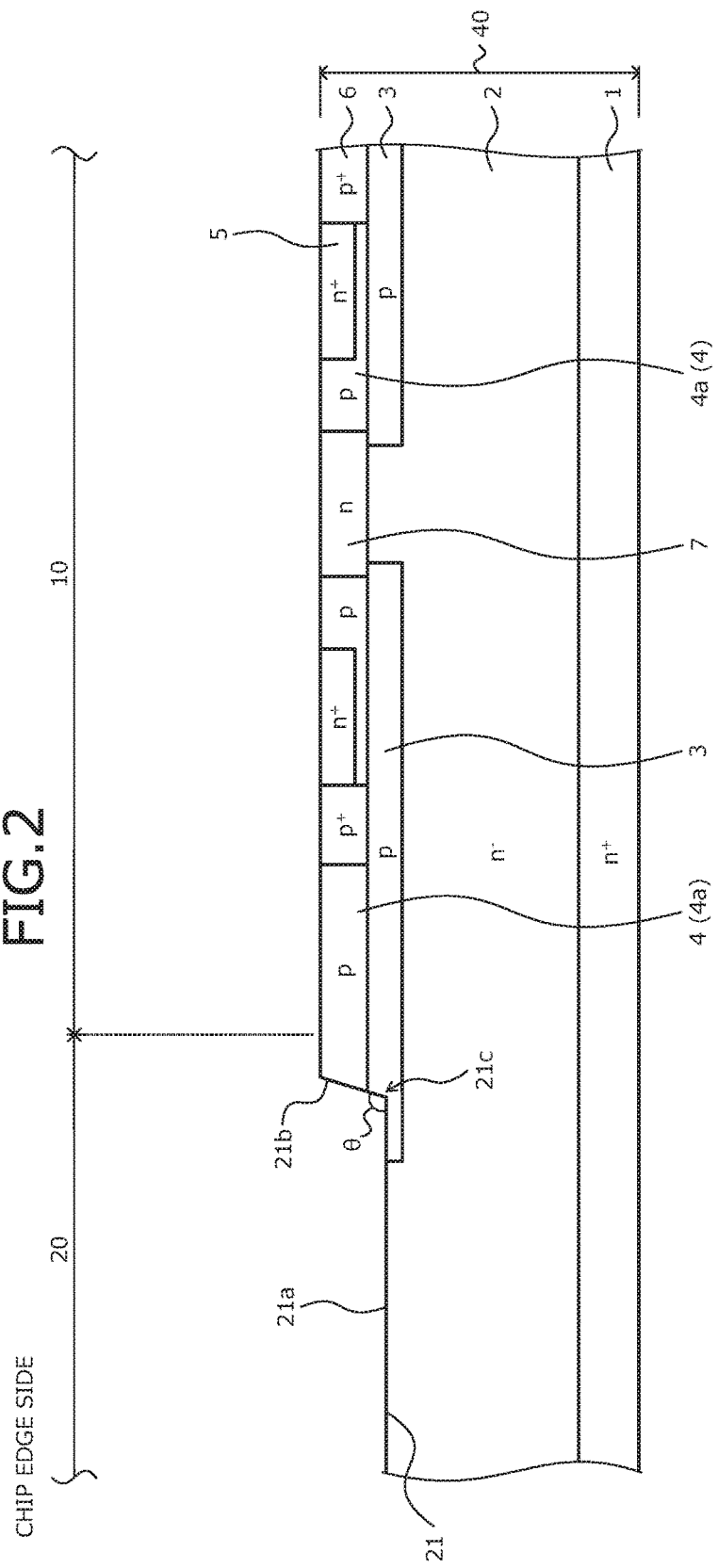
FIGS. 2, 3, and 4 are cross-sectional views of the semiconductor device according to the embodiment during manufacture.
Figure 3:
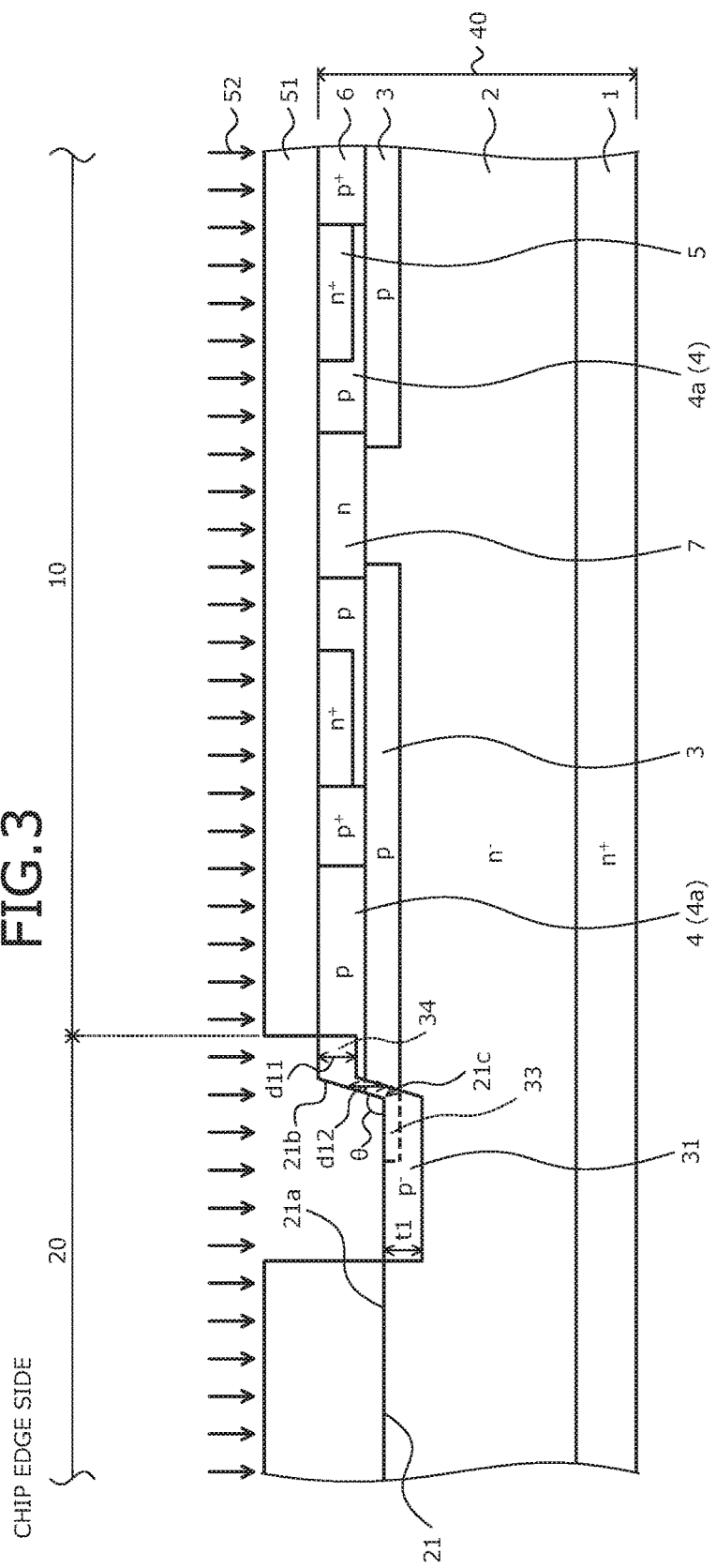
Figure 4:
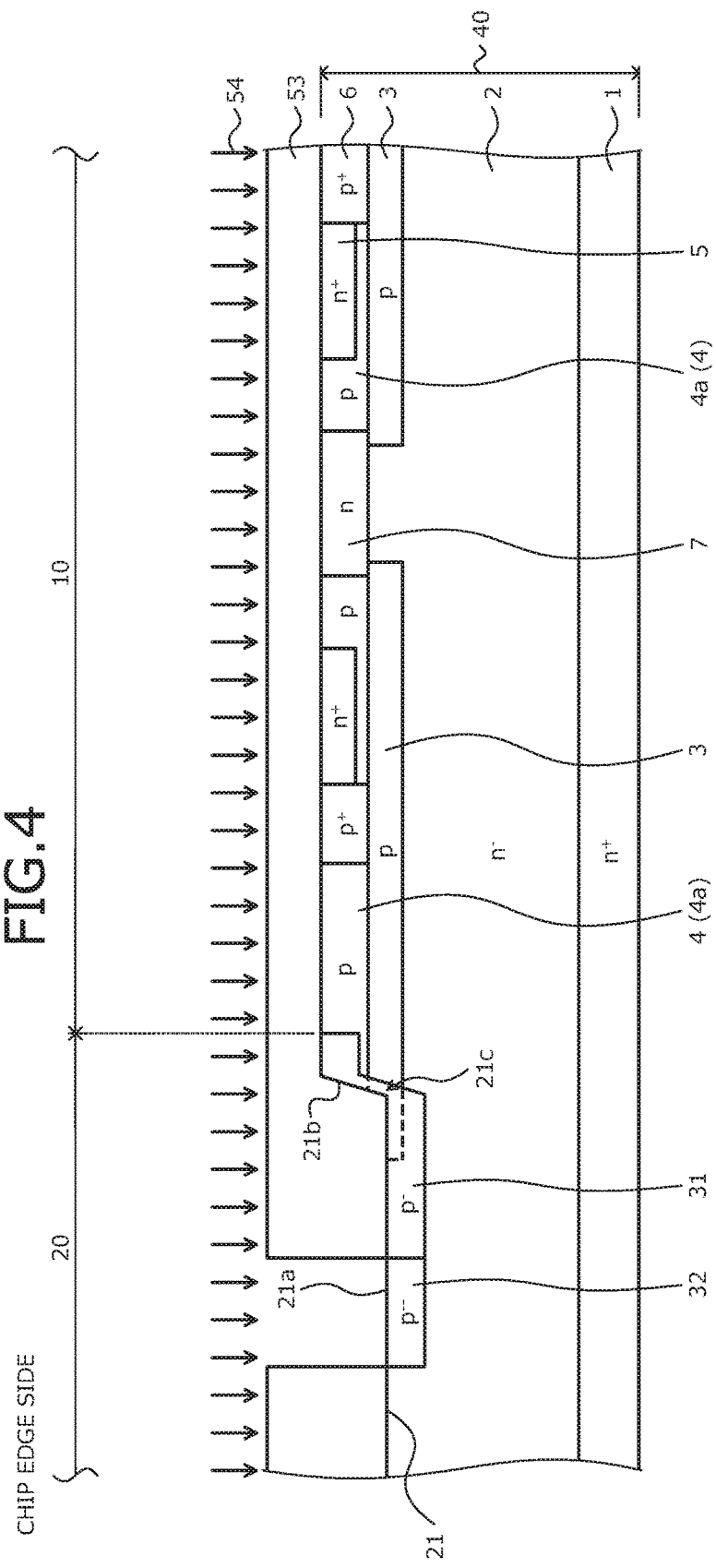

The method of manufacturing a semiconductor device according to the present embodiment will described for the case of producing a 1200 V MOSFET, as an example. FIGS. 2, 3, and 4 are cross-sectional views of the semiconductor device according to the embodiment during manufacture. For example, the n⁺-type silicon carbide substrate (semiconductor wafer) 1 of single-crystal silicon carbide doped with an n-type impurity (dopant) such as nitrogen (N) to an impurity concentration of $2.0 \times 10^{19}/cm^3$ is prepared. The front surface of the n⁺-type silicon carbide substrate 1, for example, may be a (000-1) face having an off angle of about 4 degrees in a <11-20> direction. On the front surface of the n⁺-type silicon carbide substrate 1, the n⁻-type silicon carbide layer 2 is epitaxially grown, for example, to have a thickness of 10 μm. The n⁻-type silicon carbide layer 2 has an n-type impurity such as nitrogen, for example, with an impurity concentration of $1.0 \times 10^{16}/cm^3$.

The first p-type base regions 3 are selectively formed in the surface layer of the n⁻-type silicon carbide layer 2 by photolithography and ion implantation. Here, the outermost first p-type base region 3 is formed so as to extend to the bottom 21a of the recess 21 formed at a subsequent process. In the ion implantation, for example, a p-type impurity (dopant) such as aluminum (Al) may be implanted by a dosing amount of $1.0 \times 10^{14}/cm^2$ and the impurity concentration of the first p-type base region 3 may be set as $1.0 \times 10^{18}/cm^3$. For example, the first p-type base region 3 may be disposed in a striped planar layout and the width (stripe width) and the depth may be 13 μm and 0.5 μm, respectively. An interval between adjacent first p-type base regions 3, for example, may be 2 μm. On the surface of the n⁻-type silicon carbide layer 2, the p-type silicon carbide layer 4 is epitaxially grown, for example, to have a thickness of 0.5 μm. The p-type silicon carbide layer 4 has a p-type impurity such as aluminum, for example, to an impurity concentration of $2.0 \times 10^{16}/cm^3$.

By the processes up to this point, the silicon carbide base body 40 is produced where the n⁻-type silicon carbide layer 2 and the p-type silicon carbide layer 4 are sequentially stacked on the front surface of the n⁺-type silicon carbide substrate 1. A portion of the p-type silicon carbide layer 4 is inverted to the different conductivity type to selectively form the n-type JFET region 7 by photolithography and ion implantation. In the ion implantation, an n-type impurity such as nitrogen may be implanted such that the impurity concentration of the n-type JFET region 7, for example, becomes $5.0 \times 10^{16}$/cm$^3$. The width and depth of the n-type JFET region 7, for example, may be 2.0 µm and 0.6 µm, respectively.

The n$^+$-type source region 5 and the p$^+$-type contact region 6 are formed by repeatedly performing, by differing ion implantation conditions, a process combining formation of a mask for ion implantation by photolithography and etching, ion implantation using the mask, and removal of the mask. The sequence in which the n-type JFET region 7, n$^+$-type source region 5, and the p$^+$-type contact region 6 are formed may be changed in various ways. After formation of the recess 21 described hereinafter and before activation processing, the n-type JFET region 7, the n$^+$-type source region 5, and the p$^+$-type contact region 6 may be formed.

The recess 21 is formed on the front surface of the silicon carbide base body 40, for example, at a depth of 0.7 µm by photolithography and etching; the p-type silicon carbide layer 4 is removed from the entire edge termination region 20, and the n$^-$-type silicon carbide layer 2 is exposed. As a result, the first p-type base region 3 is exposed at the bottom corner portion 21c of the recess 21 and on the active region 10 side of the bottom 21a of the recess 21. The second p-type base region 4a (the p-type silicon carbide layer 4) is exposed at the side wall 21b of the recess 21. Here, for example, the recess 21 may be formed by isotropic etching, whereby the side wall 21b of the recess 21 may be sloped to form an obtuse angle (angle θ) with the bottom 21a. The state achieved up to this point is depicted in FIG. 2.

A resist mask 51 opened at a portion corresponding to a formation region of the first JTE region 31 is formed on the front surface of the silicon carbide base body 40 by photolithography and etching. Ion implantation 52 of implanting a p-type impurity using the resist mask 51 as a mask is performed and the first JTE region 31 is formed to cover the bottom corner portion 21c of the recess 21. Here, the ion implantation 52 of implanting a p-type impurity along the side wall 21b of the recess 21 is performed and the first JTE region 31 is formed such that the first and second p-type base regions 3, 4a overlap. In FIG. 3, the portions 33, 34 of the first JTE region 31, where the first and second p-type base regions 3, 4a overlap are indicated by dotted-lines (similarly in FIG. 4). In the ion implantation 52, for example, a p-type impurity such as aluminum is implanted by a dosing amount of $1.0 \times 10^{13}$/cm$^2$ and the first JTE region 31 is formed having an impurity concentration that is lower than that of the first p-type base region 3.

Further, as described, the side wall 21b of the recess 21 is sloped at angle θ forming an obtuse angle with the bottom 21a, whereby in the ion implantation 52 from a direction (depth direction) substantially orthogonal to the front surface of the silicon carbide base body 40, a p-type impurity concentration at an equal depth from the side wall 21b is also introduced into the side wall 21b of the recess 21. Therefore, by one session of the ion implantation 52 from the direction substantially orthogonal to the front surface of the silicon carbide base body 40, the first JTE region 31 may be formed from the bottom 21a of the recess 21 to the side wall 21b. In this case, the depth d11 from the base body front surface of the portion 34 of the first JTE region 31, overlapping the second p-type base region 4a, and the depth d12 of the first JTE region 31 from the side wall 21b of the recess 21, in a direction orthogonal to the base body front surface are about equal to the thickness t1 of a portion of the first JTE region 31, at the bottom 21a of the recess 21 (d11≈t1, d12≈t1). Further, use of the resist mask 51 having an opening of a width that extends beyond the side wall 21b of the recess 21, on the active region 10 side, enables formation of the first JTE region 31 at the depth d12 that is equal across the entire side wall 21b of the recess 21. The state achieved up to this point is depicted in FIG. 3.

After the resist mask 51 used in forming the first JTE region 31 is removed, a resist mask 53 opened at a portion corresponding to a formation region of the second JTE region 32 is formed on the front surface of the silicon carbide base body 4. Ion implantation 54 of implanting a p-type impurity using the resist mask 53 as a mask is performed and the second JTE region 32 is formed at the bottom 21a of the recess 21, adjacent to the outer side of the first JTE region 31. The impurity concentration of the second JTE region 32, for example, may be about ½ the impurity concentration of the first JTE region 31. The state achieved up to this point is depicted in FIG. 4. The resist mask 53 used in forming the second JTE region 32 is removed. The sequence in which the first and second JTE regions 31, 32 are formed is interchangeable.

Heat treatment (annealing) for activating the first p-type base region 3, the n$^+$-type source region 5, the p$^+$-type contact region 6, the n-type JFET region 7, and the first and second JTE regions 31, 32 is performed, for example, at about 1620 degrees C. for about 2 minutes. For example, the front surface of the silicon carbide base body 40 is thermally oxidized by heat treatment at a temperature of about 1000 degrees C. in a mixed gas atmosphere of oxygen (O$_2$) gas and hydrogen (H$_2$) gas and, for example, the gate insulating film 8 is formed to have a thickness of about 100 nm. Thus, the entire front surface of the silicon carbide base body 40 is covered by the gate insulating film 8.

On the gate insulating film 8, for example, a polysilicon (poly-Si) layer in which phosphorus (P) is doped, is formed. The polysilicon layer is patterned and selectively removed, leaving a portion on the surface of the second p-type base region 4a, between the n$^+$-type source region 5 and the n-type JFET region 7. The polysilicon layer remaining on the gate insulating film 8 becomes the gate electrode 9. The polysilicon layer forming the gate electrode 9 may be left on the surface of the second p-type base region 4a, at a portion between the n$^+$-type source region 5 and the n-type JFET region 7, and on the n-type JFET region 7.

On the entire front surface of the silicon carbide base body 40, for example, the interlayer insulating film 12 may be formed by phosphor silicate glass (PSG), etc. to have a thickness of, for example, 1.0 µm and cover the gate electrode 9. The interlayer insulating film 12 and the gate insulating film 8 are patterned and a contact hole is formed by photolithography and etching, whereby the n$^+$-type source region 5 and the p$^+$-type contact region 6 are exposed. After the gate electrode 9 is formed and before the interlayer insulating film 12 is formed, the field oxide film 11 may be formed on the front surface of the silicon carbide base body 40 in the edge termination region 20.

The interlayer insulating film 12 is planarized by heat treatment (reflow). Subsequently, for example, on the front surface of the silicon carbide base body 40, the source electrode 13 is formed by a sputtering process so as to be embedded in the contact hole. The source electrode 13 is patterned by photolithography and etching. A thickness of the source electrode 13, for example, may be 5 µm. The material of the source electrode 13, for example, may be aluminum (Al—Si) including silicon (Si) at a rate of 1%.

On the back surface of the silicon carbide base body 40 (the back surface of the n$^+$-type silicon carbide substrate 1), for example, a nickel (Ni) film is formed as the drain electrode 15. Further, for example, an ohmic contact of the drain electrode 15 and the silicon carbide base body 40 is formed by heat treatment at 970 degrees C. On a surface of the nickel film, for example, a titanium (Ti) film, a nickel film, and a gold (Au) film are sequentially formed as the drain electrode 15. On the front surface of the silicon carbide base body 40, the protection film 14 is formed. Thereafter, the silicon carbide base body 40 is cut into discrete chips (diced), whereby the MOSFET depicted in FIG. 1 is completed.

As described, according to the present embodiment, the first JTE region is disposed from the bottom of the recess and along the side wall, whereby the first JTE region and the first base region overlap at bottom corner portion of the recess. As a result, at a portion at the bottom of the recess, the thickness of the p-type region forming the breakdown voltage structure may be prevented from becoming thinner on the active region side, whereby a decrease of the breakdown voltage of the edge termination region may be prevented. Further, the impurity concentration of the first JTE region is highest at the portion overlapping the first p-type base region (for example, an impurity concentration relatively higher by a few percent) and in terms of distribution in the depth direction, the peak of the p-type impurity concentration near the bottom corner portion of the recess may be positioned at a portion deeper on the drain side than the bottom of the recess. As a result, the load of the electric field at the bottom corner portion of the recess may be reduced by a flat portion (the bottom of the recess) farther on the outer side than the bottom corner portion of the recess and concentration of the electric field at the bottom corner portion of the recess is mitigated, whereby a predetermined breakdown voltage of the edge termination region may be stably sustained. When the impurity concentration of the first JTE region at the portion overlapping the first p-type base region is too high, the breakdown voltage of the edge termination region may decrease; however, within an impurity concentration range for a typical JTE structure, the impurity concentration of the first JTE region at the portion overlapping the first p-type base region does not increase the more the breakdown voltage of the edge termination region decreases.

Further, according to the present embodiment, even when the impurity concentration of the first base region is low, the p-type impurity concentration near the bottom corner portion of the recess may be increased, enabling high breakdown voltage of the edge termination region to be facilitated. According to the present invention, after the recess is formed in the edge termination region, the first JTE region is formed by ion implantation and therefore, without dependency on dimensional variation in the depth direction of the etching to form the recess, the first JTE region may be formed at a substantially equal depth from the bottom of the recess. As a result, variation of the impurity concentration of the first JTE region may be suppressed, enabling a predetermined breakdown voltage of the edge termination region to be stably sustained. Thus, since a predetermined breakdown voltage of the edge termination region may be stably sustained, a semiconductor device having a breakdown voltage structure in which avalanche occurs in the active region sooner than that in the edge termination region may be stably provided.

Figure 5:
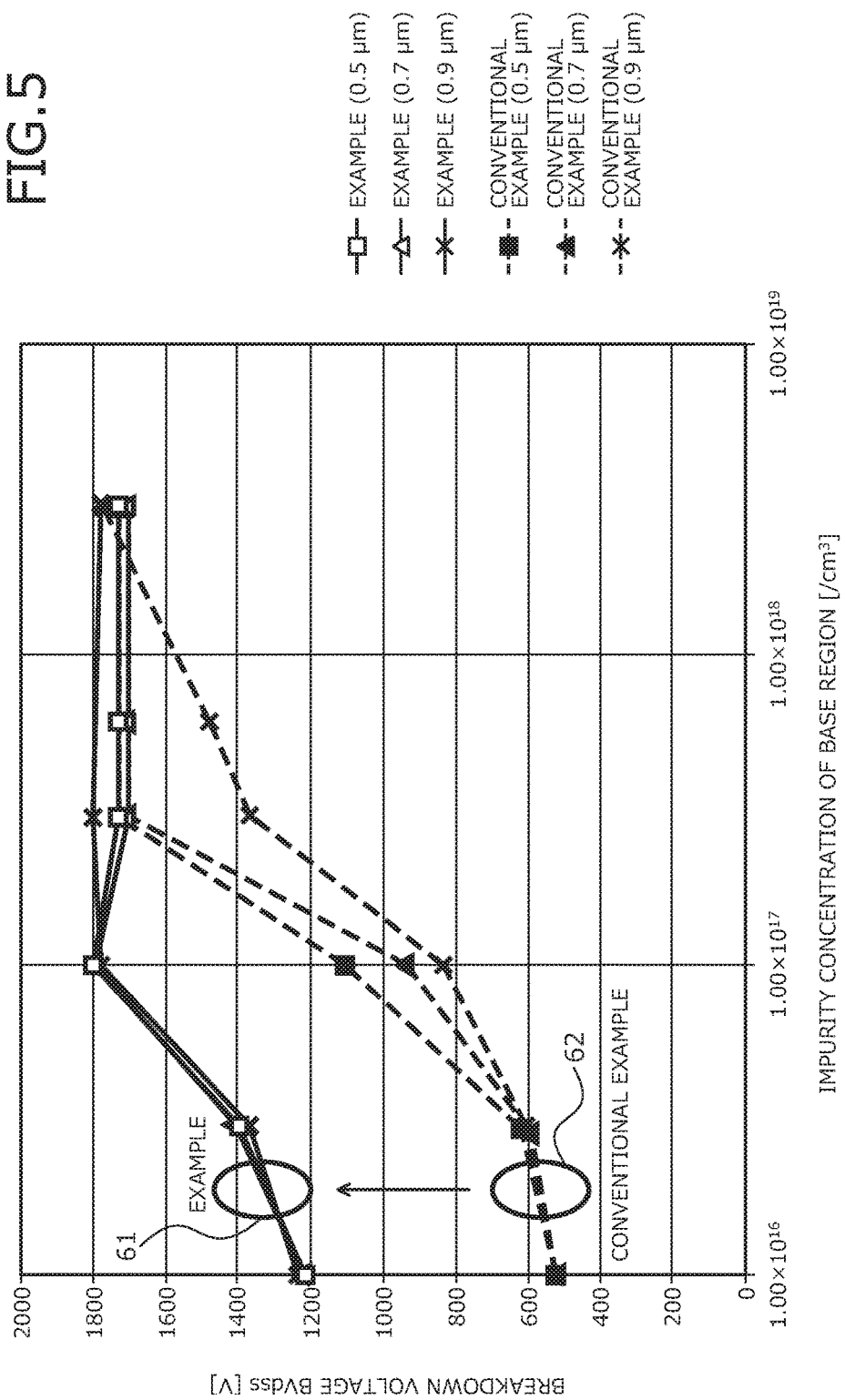
FIG. 5 is a characteristics diagram depicting breakdown voltage characteristics of the semiconductor device according to an example.

Verification concerning the relationship of the impurity concentration of the first p-type base region 3 and the breakdown voltage of the edge termination region 20 was performed. FIG. 5 is a characteristics diagram depicting breakdown voltage characteristics of the semiconductor device according to an example. The horizontal axis in FIG. 5 represents the impurity concentration of the first p-type base region 3 and the vertical axis represents the breakdown voltage of the edge termination region 20. Numbers indicated in parentheses in FIG. 5 indicate the depth of the recess 21. Multiple MOSFETs for which the depth d1 of the recess 21 and the impurity concentration of the first p-type base region 3 differed were produced according to the described structure of the semiconductor device according to the embodiment (see FIG. 1) (hereinafter, Example). In particular, with respect to three Examples for which the depth d1 of the recess 21 was 0.5 μm, 0.7 μm, and 0.9 μm, respectively, the impurity concentration of the first p-type base region 3 for each was varied by a range from $1.00 \times 10^{16}/cm^3$ to $1.00 \times 10^{19}/cm^3$. The results of measurement of the breakdown voltage of the edge termination region 20 in samples of the Examples are depicted in FIG. 5. In FIG. 5, breakdown voltage characteristics of the edge termination region 120 of the conventional semiconductor device (see FIG. 6) are also depicted (hereinafter, conventional example). In the conventional examples, the first JTE region 131 was formed only at the bottom 121a of the recess 121 and the first and second p-type base regions 103, 104a were not overlapped. The depth of the recess 121 of the conventional example and the impurity concentration of the first p-type base region 103 were the same as the Examples.

From the results depicted in FIG. 5, in the conventional examples, the breakdown voltage of the edge termination region 120 was confirmed to significantly decrease corresponding to decreases in the impurity concentration of the first p-type base region 103 (for example, see the portion indicated by reference numeral 62). Further, in the conventional examples, the breakdown voltage of the edge termination region 120 was confirmed to decrease corresponding to increases in the depth of the recess 121. On the other hand, in the Examples, even when the impurity concentration of the first p-type base region 3 was of a low range (for example, see the portion indicated by reference numeral 61), the breakdown voltage of the edge termination region 20 was confirmed to be significantly improved compared to the conventional examples. Therefore, even when the impurity concentration of the first p-type base region 3 is low, the breakdown voltage of the edge termination region 20 may be improved. Further, in the Examples, breakdown voltage characteristics of the edge termination region 20 were confirmed to be dependent on the impurity concentration of the first p-type base region 3 and to be independent of the depth d1 of the recess 21. Therefore, it was confirmed that in the present invention, without dependency on dimensional variation in the depth direction of the etching to form the recess 21, a predetermined breakdown voltage of the edge termination region 20 may be stably prevented.

The present invention is not limited to the described embodiment and various changes are possible without departing from the spirit of the invention. For example, in the embodiment, although a MOSFET is described as an example, without limitation to the above embodiment, application to a semiconductor device of various device structures such as a bipolar transistor, IGBT, etc. is possible. Further, dimensions and impurity concentrations of components, etc. are configured corresponding to required specifications. In the embodiment, although a double-zone JTE structure in which 2 JTE regions are adjacently disposed is described as an example, the innermost JTE region may be disposed to cover the bottom corner portion of the recess, or may be configured as a multi-zone JTE structure having 3 or more contacting JTE regions of progressively lower impurity concentrations the farther on the outer side the JTE region is disposed. Further, the present invention achieves the same effects in a semiconductor device that uses another wide band gap semiconductor material such as gallium nitride (GaN) and a semiconductor device that uses silicon. In the embodiment, although the first conductivity type is assumed to be an n-type and the second conductivity type is assumed to be a p-type, the invention is further applicable when the first conductivity type is a p-type and the second conductivity type is an n-type.

Figure 6:
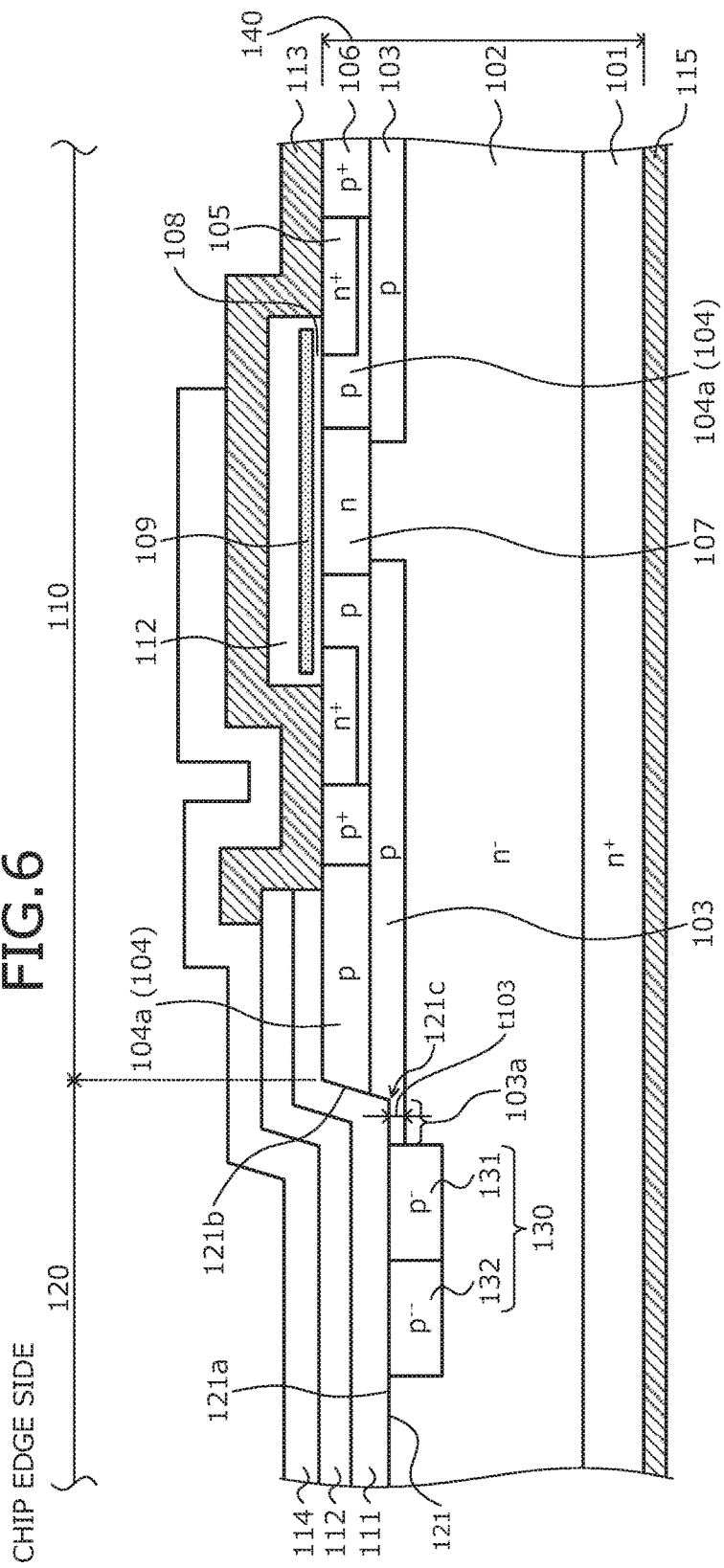
FIG. 6 is a cross-sectional view of a structure of a conventional semiconductor device.

However, in the conventional MOSFET of the structure depicted in FIG. 6, the p-type silicon carbide layer 104 stacked as the uppermost layer of the silicon carbide base body 140 is a region that is unnecessary in the edge termination region 120 and therefore, the recess 121 is formed to expose the n$^-$-type silicon carbide layer 102 in the edge termination region 120. Here, a thickness t103 of the portion 103a of the p-type base region 103 preliminarily formed in the n$^-$-type silicon carbide layer 102, extending into the bottom 121a of the recess 121 may become thin consequent to dimensional variation in the depth direction, during the etching to form the recess 121. As a result, at the portion 103a of the p-type base region 103 extending into the bottom 121a of the recess 121, variation of the impurity concentration occurs, arising in a problem of decreased breakdown voltage of the edge termination region 120.

In Japanese Patent Application Laid-Open Publication No. 2010-045388, since the p-type impurity concentration from the bottom to the side wall of the recess is uniform, electric field concentrates at the bottom corner portion of the recess (the boundary of the bottom 121a of the recess 121 and the side wall 121b), giving rise to a problem of an inability to stabilize and prevent the breakdown voltage of the edge termination region. In Japanese Patent Application Laid-Open Publication Nos. 2002-164541 and 2014-107500, although a difference in the p-type impurity concentration occurs at the side wall of the recess, the peak of the p-type impurity concentration is located at a portion farther on the active region side than the bottom corner portion of the recess, i.e., is located at a portion that is shallow from the base body front surface of the side wall of the recess. Therefore, similar to Japanese Patent Application Laid-Open Publication No. 2010-045388, in Japanese Patent Application Laid-Open Publication Nos. 2002-164541 and 2014-107500 as well, the electric field concentrates at the bottom corner portion of the recess.

According to the present invention, the innermost semiconductor region of the second conductivity type and the first semiconductor region overlap at bottom corner portion of the recess (boundary of the bottom and side wall of the recess) and therefore, the peak of the second conductivity type impurity concentration at the bottom corner portion of the recess is located at a portion on the drain side (the second electrode side), deeper than the bottom of the recess. As a result, the concentration of the electric field at the bottom corner portion of the recess may be mitigated.

The semiconductor device and the method of manufacturing a semiconductor device according to the present invention achieve an effect in that a predetermined breakdown voltage of the edge termination region may be held, enabling a stable, high-voltage semiconductor device to be provided.

As described, the semiconductor device and the method of manufacturing a semiconductor device according to the present invention are useful for semiconductors used as switching devices and are particularly suitable for vertical-type MOSFETs using a wide band gap semiconductor.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
an active region in which main current flows, the active region disposed on a semiconductor substrate of a first conductivity type and formed of a semiconductor material having a band gap that is wider than that of silicon;
an edge termination region surrounding a periphery of the active region;
a recess where the edge termination region is lower than the active region, disposed on a front surface of the semiconductor substrate;
a first semiconductor region of a second conductivity type, selectively disposed on a front surface side of the semiconductor substrate in the active region and extending to under a first face formed in the edge termination region by the recess; and
semiconductor regions of the second conductivity type disposed in the first face to have a concentric ring-shape surrounding the periphery of the active region and to have progressively lower impurity concentrations as proximity to an outer side increases, wherein
an innermost semiconductor region among the semiconductor regions of the second conductivity type is disposed from the first face, along a third face between the first face and a second face farther on the active region side than the recess,
an upper portion of the innermost semiconductor region is positioned to overlap, in a depth direction, a portion of the first semiconductor region, at a boundary of the first face and the third face, and
a lower portion of the innermost semiconductor region extends farther in the depth direction than the upper portion.

2. The semiconductor device according to claim 1, wherein
the innermost semiconductor region has an impurity concentration that is highest at the lower portion.

3. The semiconductor device according to claim 1, wherein
a thickness of the innermost semiconductor region is thicker than a thickness of the first semiconductor region, at the first face.

4. The semiconductor device according to claim 1, wherein
the third face is sloped to form an obtuse angle with the first face.

5. The semiconductor device according to claim 1, further comprising:
a second semiconductor region of the first conductivity type, selectively disposed in the first semiconductor region;
a gate insulating film disposed to contact a region of the first semiconductor region between the second semiconductor region and the semiconductor substrate;
a gate electrode disposed via the gate insulating film, on a side opposite the first semiconductor region;
a first electrode disposed to contact the first semiconductor region and the second semiconductor region; and
a second electrode disposed to contact a back surface of the semiconductor substrate.

6. The semiconductor device according to claim 1, wherein
the semiconductor material having a band gap that is wider than that of silicon is silicon carbide.

7. A method of manufacturing a semiconductor device including an active region disposed on a semiconductor substrate of a first conductivity type and formed from a semiconductor material having a band gap that is wider than that of silicon, and an edge termination region surrounding a periphery of the active region, the method comprising:
forming on a front surface of the semiconductor substrate, a recess where the edge termination region is lower than the active region;
selectively forming on a front surface side of the semiconductor substrate in the active region, a first semiconductor region of a second conductivity type, the first semiconductor region formed to extend under a first face formed in the edge termination region by the recess; and
forming in the first face, semiconductor regions of the second conductivity type, the semiconductor regions formed to have a concentric ring-shape surrounding the periphery of the active region and to have progressively lower impurity concentrations as proximity to an outer side increases, wherein
forming the semiconductor regions of the second conductivity type includes forming an innermost semiconductor region among the semiconductor regions of the second conductivity type from the first face, along a third face between the first face and a second face farther on the active region side than the recess,
forming an upper portion of the innermost semiconductor region to overlap, in a depth direction, a portion of the first semiconductor region, at a boundary of the first face and the third face, and
forming a lower portion of the innermost semiconductor region to extend farther in the depth direction than the upper portion.

8. The semiconductor device according to claim 1, wherein the upper portion and the lower portion of the innermost semiconductor region occupy a same area in part, in the depth direction, as the portion of the first semiconductor region.

9. The semiconductor device according to claim 2, wherein the first semiconductor region of the second conductivity type includes a first base region and a second base region located over the first base region, the portion of the innermost semiconductor region having the impurity concentration that is highest being located in the first base region, and a portion of the innermost semiconductor region occupying a same area in part as the second base region having a lower impurity concentration than the portion of the innermost semiconductor region located in the first base region.

* * * * *